(12) United States Patent
Kato

(10) Patent No.: US 8,084,833 B2
(45) Date of Patent: Dec. 27, 2011

(54) SEMICONDUCTOR DEVICE

(75) Inventor: Shinjiro Kato, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 12/807,853

(22) Filed: Sep. 15, 2010

(65) Prior Publication Data

US 2011/0062516 A1    Mar. 17, 2011

(30) Foreign Application Priority Data

Sep. 17, 2009 (JP) .................................. 2009-216244

(51) Int. Cl.
*H01L 21/76* (2006.01)
(52) U.S. Cl. ................................. 257/396; 257/E21.552
(58) Field of Classification Search .................. 257/395, 257/396, 399, E21.552
See application file for complete search history.

(56) References Cited

U.S. PATENT DOCUMENTS

| | | | | |
|---|---|---|---|---|
| 5,627,394 A * | 5/1997 | Chang et al. | ................... | 257/335 |
| 6,306,700 B1 * | 10/2001 | Yang | ............................. | 438/217 |
| 6,784,490 B1 * | 8/2004 | Inoue et al. | ................... | 257/344 |
| 6,841,837 B2 * | 1/2005 | Inoue | ............................. | 257/409 |
| 2003/0109112 A1 * | 6/2003 | Wu | ............................. | 438/400 |
| 2009/0032870 A1 * | 2/2009 | Iida | ............................. | 257/339 |

OTHER PUBLICATIONS

Patent Abstracts of Japan, publication No. 11-026766, publication date Jan. 29, 1999.

* cited by examiner

*Primary Examiner* — Colleen Matthews
(74) *Attorney, Agent, or Firm* — Adams & Wilks

(57) ABSTRACT

Provided is a LOCOS offset MOS field-effect transistor in which a first lightly-doped N-type drain offset region with a LOCOS oxide film and a second lightly-doped N-type drain offset region without a LOCOS oxide film are formed in a drain-side offset region, and both the regions are covered with a gate electrode. Provision of the first lightly-doped N-type drain offset region mitigates an electric field applied to the first lightly-doped N-type drain offset region to increase a breakdown voltage. Provision of the second lightly-doped N-type drain offset region increases carriers within the second lightly-doped N-type drain offset region to obtain a high current drivability.

2 Claims, 3 Drawing Sheets

Prior Art

US 8,084,833 B2

SEMICONDUCTOR DEVICE

BACKGROUND OF THE INVENTION

1. Field of the Invention

The present invention relates to a semiconductor device. More specifically, the present invention relates to a LOCOS offset field-effect transistor having a high breakdown voltage and a high current drivability.

2. Description of the Related Art

FIG. 2 illustrates an example of a conventional N-channel LOCOS offset MOS field-effect transistor having a high breakdown voltage structure. An N-channel LOCOS offset MOS field-effect transistor 101 includes a P-type silicon substrate 16, a P-type well region 17, a lightly-doped N-type source LOCOS offset region 18, a lightly-doped N-type drain LOCOS offset region 19, a heavily-doped N-type source region 20, a heavily-doped N-type drain region 21, a channel formation region 22, a gate oxide film 23, a gate electrode 24, LOCOS oxide films 25, a protective oxide film 26, a source electrode 27, a drain electrode 28, and the like. As illustrated in FIG. 2, features of the MOS field-effect transistor 101 reside in that the lightly-doped N-type drain LOCOS offset region 19 is formed between the channel formation region 22 and the heavily-doped N-type drain region 21 for the purpose of increasing a breakdown voltage, and in that the LOCOS oxide films 25 are each formed to be as thick as 5,000 Å to 10,000 Å for the purpose of preventing a channel formation in a parasitic field transistor formed between elements. In general a drain breakdown voltage of a MOS field-effect transistor having a large channel length is determined as a voltage at which an avalanche breakdown occurs in a portion to which the largest electric field is applied in a depletion layer formed at a boundary between the channel formation region and the drain region, that is, a surface portion which is the most sensitive to a gate potential. The reason for a high drain breakdown voltage of the MOS field-effect transistor 101 is that a bird's beak of the LOCOS oxide film 25 is positioned in the vicinity of the boundary surface between the channel formation region 22 and the offset region 19, alleviating the influence of the gate potential so that an avalanche breakdown may less likely occur.

Further reduction of a dopant concentration of the offset region 19 to increase a width of the depletion layer to obtain a higher breakdown voltage leads to an increase of the resistance of the offset region 19, causing a generation of Joule heat in the offset region 19 to break down the element at a turning on of the transistor to get a large drain current. There is a trade-off relationship between a high breakdown voltage and a current drivability.

In view of the above-mentioned problem, Japanese Patent Application Laid-open No. H 11-26766 proposes the following method. Japanese Patent Application Laid-open No. H11-26766 discloses a method of optimizing a film thickness of a LOCOS oxide film to a film thickness satisfying the following two conditions. The first condition is a film thickness condition as to whether to suppress the above-mentioned influence of the gate potential on the avalanche breakdown. The second condition is a film thickness condition as to whether or not the gate potential may allow the surface of the lightly-doped drain LOCOS offset region to enter an accumulated state. If the film thickness of the LOCOS oxide film is set to an optimum film thickness, a high breakdown voltage element having a high current drivability may be produced.

In a case where the above-mentioned conventional example is utilized to produce a high breakdown voltage element having a high current drivability, because the above-mentioned two conditions are inherently in a trade-off relationship, it is difficult to select an optimum film thickness satisfying the two conditions simultaneously.

SUMMARY OF THE INVENTION

The present invention provides a LOCOS offset MOS field-effect transistor having a high breakdown voltage in which a first lightly-doped drain offset region with a LOCOS oxide film and a second lightly-doped drain offset region without a LOCOS oxide film are formed in a drain-side offset region, and both the regions are covered with a gate electrode. Specifically, the following means is employed.

The present invention provides a semiconductor device including: a first conductivity type semiconductor substrate; a first conductivity type well region formed in a surface of the first conductivity type semiconductor substrate; a second conductivity type well region formed in contact with the first conductivity type well region; a heavily-doped second conductivity type source region formed at a top of the first conductivity type well region; a channel formation region; a lightly-doped second conductivity type source offset region formed in contact with the heavily-doped second conductivity type source region so as to be spaced away from the second conductivity type well region by a length of the channel formation region; a heavily-doped second conductivity type drain region formed at a top of the second conductivity type well region; a second lightly-doped second conductivity type drain offset region formed in contact with the heavily-doped second conductivity type drain region on a side of the channel formation region; a first lightly-doped second conductivity type drain offset region formed at the top of the second conductivity type well region in contact with the channel formation region and the second lightly-doped second conductivity type drain offset region; a LOCOS oxide film formed in a surface portion of the first conductivity type semiconductor substrate except for the heavily-doped second conductivity type source region, the channel formation region, the second lightly-doped second conductivity type drain offset region, and the heavily-doped second conductivity type drain region; a gate oxide film which is formed on: a part of the LOCOS oxide film formed in contact with the channel formation region on a source side; the channel formation region; an entirety of the LOCOS oxide film formed in contact with the channel formation region on a drain side; and the second lightly-doped second conductivity type drain offset region; a gate electrode formed on the gate oxide film; a source electrode formed on the heavily-doped second conductivity type source region; a drain electrode formed on the heavily-doped second conductivity type drain region; and a protective oxide film formed over the surface of the first conductivity type semiconductor substrate except for the source electrode and the drain electrode.

In the drain-side offset region, the first lightly-doped drain offset region with the LOCOS oxide film and the second lightly-doped drain offset region without the LOCOS oxide film are formed so that the first lightly-doped drain offset region may mitigate a magnitude of an electric field applied to the first lightly-doped drain offset region, to thereby produce a high breakdown voltage MOS field-effect transistor. In addition, the second lightly-doped drain offset region without the LOCOS oxide film is formed so that an electric field may be applied from the gate electrode formed above the second lightly-doped drain offset region to allow the second lightly-doped drain offset region to enter an accumulated state. As a result, carrier density of the second lightly-doped drain offset region may be increased with the gate voltage remaining large, to thereby enhance a current drivability as well.

DETAILED DESCRIPTION OF THE PREFERRED EMBODIMENTS

Now, referring to the accompanying drawings, exemplary embodiments of the present invention are described.

First Embodiment

Figure 1:
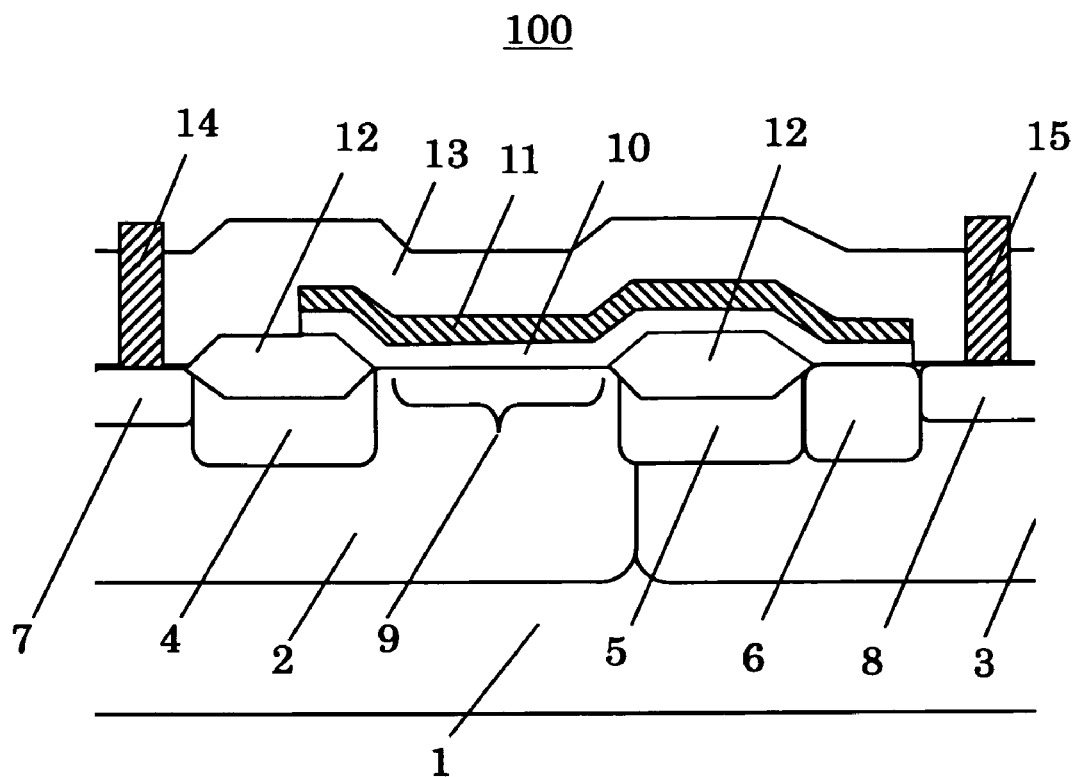
FIG. 1 is a cross-sectional view of a semiconductor device according to a first embodiment of the present invention.
Figure 2:
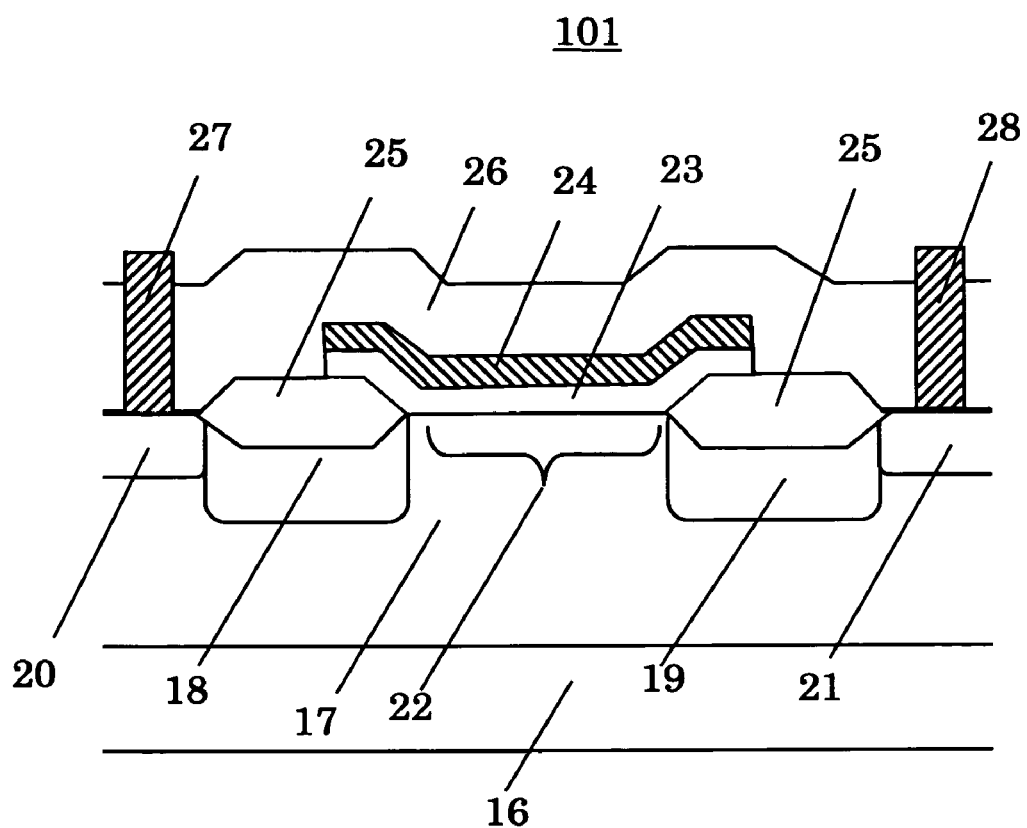
FIG. 2 is a cross-sectional view of a semiconductor device in a conventional MOS field-effect transistor.

FIG. 1 is a cross-sectional view of a semiconductor device 100 according to a first embodiment of the present invention. Herein, an N-channel MOS transistor is described by way of example. The semiconductor device 100 of FIG. 1 has the following exemplary structure. In a surface of a P-type silicon substrate 1 having a resistance of 20 to 30 Ω·cm, a lightly-doped P-type well region 2 is formed at a depth of 20 μm with boron or the like doped at a concentration of approximately $1 \times 10^{16}$ cm$^{-3}$, and a lightly-doped N-type well region 3 is formed in contact with the P-type well region 2 at a depth of 20 μm with phosphorus or the like doped at a concentration of approximately $1 \times 10^{16}$ cm$^{-3}$.

Next, using a resist pattern as a mask, ion implantation is performed to form a lightly-doped N-type source offset region 4 at a depth of 1 μm with phosphorus or the like doped at approximately $5 \times 10^{17}$ cm$^{-3}$. In addition, using a resist pattern as a mask, ion implantation is performed to form a lightly-doped N-type drain offset region 5 at a depth of 1 μm with phosphorus or the like doped at approximately $5 \times 10^{17}$ cm$^{-3}$. Then, selective oxidation is performed to form a thermal oxide film of approximately 8,000 Å thickness on each of the lightly-doped N-type source offset region 4 and the lightly-doped N-type drain offset region 5 so as to grow as a LOCOS oxide film 12. Subsequently, using a resist pattern as a mask, ion implantation is performed to form another lightly-doped N-type drain offset region 6 at a depth of 1 μm with phosphorus or the like doped at approximately $5 \times 10^{17}$ cm$^{-3}$.

Subsequently, thermal oxidation is performed to form a gate oxide film 10 of approximately 1,000 Å thickness on the silicon surface. Subsequently, chemical vapor deposition (CVD) is performed to form a polycrystalline silicon film of approximately 4,000 Å thickness over the gate oxide film 10. Then, phosphorus or the like is doped and diffused into the polycrystalline silicon film at approximately $1 \times 10^{20}$ cm$^{-3}$. Then, a resist pattern is formed and dry etching is performed to form a gate electrode 11 so as to cover a range from a part of the LOCOS oxide film 12 formed on the lightly-doped N-type source offset region 4 to the lightly-doped N-type drain offset region 6 through a channel formation region 9 and the lightly-doped N-type drain offset region 5.

Subsequently, using a resist pattern as a mask, ion implantation is performed to dope the silicon surface with arsenic or the like at approximately $1 \times 10^{20}$ cm$^{-3}$, to thereby form a heavily-doped N-type source region 7 and a heavily-doped N-type drain region 8 at a depth of 0.4 μm. Subsequently, a protective oxide film 13 is formed at a thickness of approximately 7,000 Å by CVD or the like. Subsequently, an opening is formed in the protective oxide film 13 at a position on each of the heavily-doped N-type source region 7 and the heavily-doped N-type drain region 8. Then, an aluminum alloy is deposited therein and patterned to form a source electrode 14 on the heavily-doped N-type source region 7 and a drain electrode 15 on the heavily-doped N-type drain region 8.

With the above-mentioned structure, in the drain-side offset region, the first lightly-doped drain offset region with the LOCOS oxide film and the second lightly-doped drain offset region without the LOCOS oxide film are formed so that the first lightly-doped drain offset region may mitigate a magnitude of an electric field applied to the first lightly-doped drain offset region, to thereby produce a high breakdown voltage MOS field-effect transistor. In addition, the second lightly-doped drain offset region without the LOCOS oxide film is formed so that an electric field may be applied from the gate electrode formed above the second lightly-doped drain offset region to allow the second lightly-doped drain offset region to enter an accumulated state. As a result, carrier density of the second lightly-doped drain offset region may be increased with the gate voltage remaining large, to thereby enhance a current drivability as well.

Second Embodiment

Figure 3:
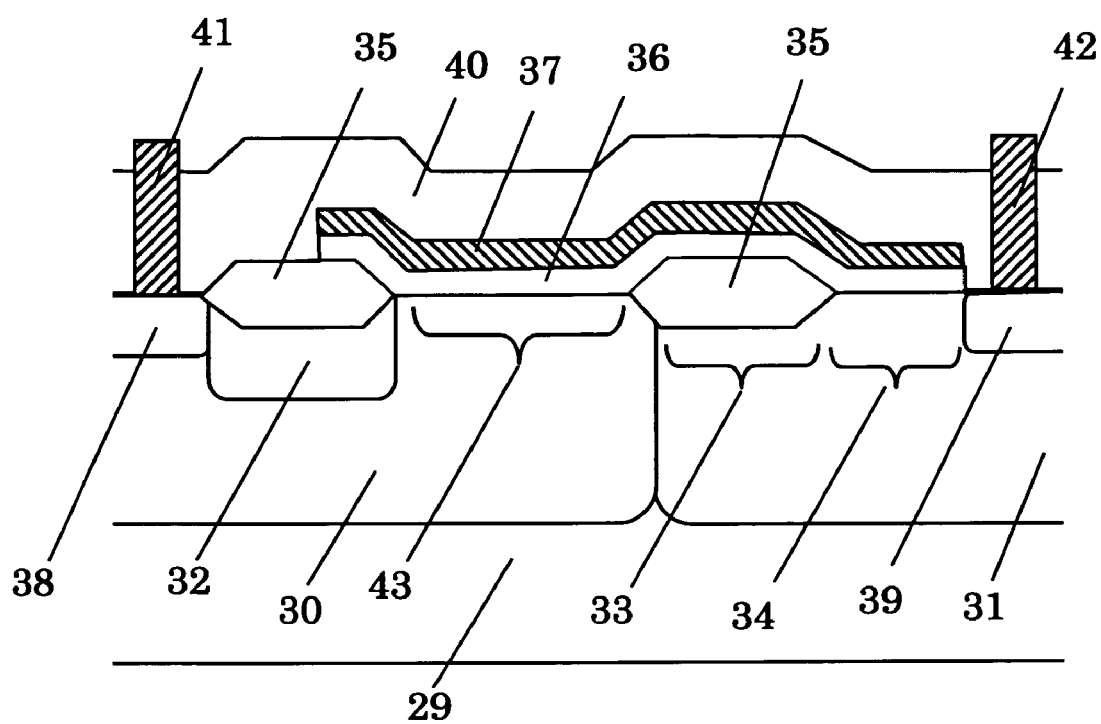
FIG. 3 is a cross-sectional view of a semiconductor device according to a second embodiment of the present invention.

FIG. 3 is a cross-sectional view of a semiconductor device 102 according to a second embodiment of the present invention. The semiconductor device 102 of FIG. 3 has the following exemplary structure. In a surface of a P-type silicon substrate 29 having a resistance of 20 to 30 Ω·cm, a lightly-doped P-type well region 30 is formed at a depth of 20 μm with boron or the like doped at a concentration of approximately $1 \times 10^{16}$ cm$^{-3}$, and a lightly-doped N-type well region 31 is formed in contact with the P-type well region 30 at a depth of 20 μm with phosphorus or the like doped at approximately $1 \times 10^{17}$ cm$^{-3}$. Next, using a resist pattern as a mask, ion implantation is performed to form a lightly-doped N-type source offset region 32 at a depth of 1 μm with phosphorus or the like doped at approximately $5 \times 10^{17}$ cm$^{-3}$ in a region at the top of the P-type well region 30 which is spaced away from the N-type well region 31 by a length of a channel formation region 43.

Subsequently, selective oxidation is performed to form a thermal oxide film of approximately 8,000 Å thickness on each of the lightly-doped N-type source offset region 32 and a first drain offset region 33 so as to grow as a LOCOS oxide film 35. In this case, an available method of forming a second drain offset region 34 is as follows. First, selective oxidation is performed to form the thermal oxide film of approximately 8,000 Å thickness on each of the lightly-doped N-type source offset region 32, the first drain offset region 33, and the second drain offset region 34 so as to grow as the LOCOS oxide film 35. Then, using a photoresist, wet etching is performed to remove the LOCOS oxide film on the second drain offset region 34, and thermal oxidation is subsequently performed to form a gate oxide film 36 of approximately 1,000 Å thickness on the silicon surface.

Subsequently, CVD is performed to form a polycrystalline silicon film of approximately 4,000 Å thickness over the gate oxide film 36. Then, phosphorus or the like is doped and diffused into the polycrystalline silicon film at approximately $1 \times 10^{20}$ cm$^{-3}$. Then, a resist pattern is formed and dry etching is performed to form a gate electrode 37 so as to cover a range from a part of the LOCOS oxide film 35 formed on the lightly-doped N-type source offset region 32 to the second drain offset region 34. Subsequently, using a resist pattern as a mask, ion implantation is performed to dope the silicon surface with arsenic or the like at approximately $1\times10^{20}$ cm$^{-3}$, to thereby form a heavily-doped N-type source region 38 and a heavily-doped N-type drain region 39 at a depth of 0.4 μm.

Subsequently, a protective oxide film 40 is formed at a thickness of approximately 7,000 Å by CVD or the like. Subsequently, an opening is formed in the protective oxide film 40 at a position on each of the heavily-doped N-type source region 38 and the heavily-doped N-type drain region 39. Then, an aluminum alloy is deposited therein and pattered to form a source electrode 41 on the heavily-doped N-type source region 38 and a drain electrode 42 on the heavily-doped N-type drain region 39.

It should be understood that the structure according to the second embodiment can also produce the same effect as in the first embodiment.

What is claimed is:

1. A semiconductor device, comprising:
a semiconductor substrate of a first conductivity type;
a first well region of a first conductivity type formed in a surface of the semiconductor substrate;
a second well region of a second conductivity type formed in the surface of the semiconductor substrate and in contact with the first well region;
a heavily-doped source region of a second conductivity type formed on the first well region;
a lightly-doped source offset region of a second conductivity type formed on the first well region and in contact with the heavily-doped source region;
a channel formation region configured on the fist well region and next to the heavily-doped source region;
a heavily-doped drain region of a second conductivity type formed on the second well region;
a first lightly-doped drain offset region of a second conductivity type formed on the second well region so as to be spaced away from the lightly-doped source offset region by a length of the channel formation region;
a second lightly-doped drain offset region of a second conductivity type formed between the heavily-doped drain region and the first lightly-doped drain offset region and in contact with both of them;
a LOCOS oxide film formed in a surface portion of the semiconductor substrate, the LOCOS oxide film comprising a first LOCOS oxide region formed on the lightly-doped source offset region and a second LOCOS oxide region formed on the first lightly-doped drain offset region;
a gate oxide film formed on:
 a part of the first LOCOS oxide region formed in contact with the channel formation region on a source side,
 the channel formation region,
 an entirety of the second LOCOS oxide region formed in contact with the channel formation region on a drain side, and
 the second lightly-doped drain offset region;
a gate electrode formed on the gate oxide film;
a source electrode formed on the heavily-doped source region; and
a drain electrode formed on the heavily-doped drain region.

2. A semiconductor device, comprising:
a semiconductor substrate of a first conductivity type;
a first well region of a first conductivity type formed in a surface of the semiconductor substrate;
a second well region of a second conductivity type formed in the surface of the semiconductor substrate and in contact with the first well region;
a heavily-doped source region of a second conductivity type formed on the first well region;
a lightly-doped source offset region of a second conductivity type formed on the first well region and in contact with the heavily-doped source region;
a channel formation region configured on the fist well region and next to the heavily-doped source region;
a first lightly-doped drain offset region of a second conductivity type formed on the second well region so as to be spaced away from the lightly-doped source offset region by a length of the channel formation region;
a second drain offset region of a second conductivity type formed on the second well region and next to the first lightly-doped drain offset region;
a heavily-doped drain region of a second conductivity type formed on the second well region so as to be spaced away from the first well region by lengths of the lightly-doped first drain offset region and the second drain offset region;
a LOCOS oxide film formed in a surface portion of the semiconductor substrate, the LOCOS oxide film comprising a first LOCOS oxide region formed on the lightly-doped source offset region and a second LOCOS oxide region formed on the first lightly-doped drain offset region;
a gate oxide film which is formed on:
 a part of the first LOCOS oxide region formed in contact with the channel formation region on a source side,
 the channel formation region,
 an entirety of the second LOCOS oxide region formed in contact with the channel formation region on a drain side, and
 the second drain offset region;
a gate electrode formed on the gate oxide film;
a source electrode formed on the heavily-doped source region; and
a drain electrode formed on the heavily-doped drain region.

* * * * *